(12) United States Patent
Esser

(10) Patent No.: US 9,352,427 B2
(45) Date of Patent: *May 31, 2016

(54) METHOD FOR PRODUCING PISTON RINGS

(75) Inventor: Peter-Klaus Esser, Kuerten (DE)

(73) Assignee: Federal-Mogul Burscheid GmbH, Burscheid (DE)

(*) Notice: Subject to any disclaimer, the term of this patent is extended or adjusted under 35 U.S.C. 154(b) by 402 days.

This patent is subject to a terminal disclaimer.

(21) Appl. No.: 14/005,969

(22) PCT Filed: Feb. 2, 2012

(86) PCT No.: PCT/DE2012/000087
§ 371 (c)(1),
(2), (4) Date: Sep. 18, 2013

(87) PCT Pub. No.: WO2012/126446
PCT Pub. Date: Sep. 27, 2012

(65) Prior Publication Data
US 2014/0008874 A1 Jan. 9, 2014

(30) Foreign Application Priority Data
Mar. 19, 2011 (DE) .......................... 10 2011 014 483

(51) Int. Cl.
*B23P 15/06* (2006.01)
*C23C 8/04* (2006.01)
(Continued)

(52) U.S. Cl.
CPC . *B23P 15/06* (2013.01); *C23C 8/04* (2013.01); *C23C 8/80* (2013.01); *C23C 14/0611* (2013.01);
(Continued)

(58) Field of Classification Search
CPC ......... B23P 15/06; C23C 30/005; C23C 8/80; C23C 28/32; C23C 28/00; C23C 14/22; C23C 28/343; C23C 14/0611; C23C 8/04; C23C 28/34; C23C 28/023; F16J 9/26; Y10T 29/49274; Y10T 29/49282; Y10T 29/49284; Y10T 29/49281

See application file for complete search history.

(56) References Cited

U.S. PATENT DOCUMENTS

| 3,337,938 A * | 8/1967 | Prasse .................... B23P 15/08 29/527.4 |
|---|---|---|
| 2007/0128807 A1 | 6/2007 | Fischer et al. |
| 2007/0252338 A1 | 11/2007 | Maier et al. |
| 2010/0019457 A1 | 1/2010 | Esser et al. |
| 2010/0019458 A1 | 1/2010 | Esser et al. |

FOREIGN PATENT DOCUMENTS

| DE | 1 675 376 | 11/1971 |
|---|---|---|
| DE | 102 21 800 | 12/2003 |

(Continued)

OTHER PUBLICATIONS

English Machine Translation of DE102005023627(A1), Nov. 30, 2006.*

*Primary Examiner* — Sarang Afzali
(74) *Attorney, Agent, or Firm* — Jordan and Hamburg LLP

(57) ABSTRACT

A method for producing a recessed steel piston ring provided with a wear-resistant layer includes generating a main body that has a recess on the running surface side and that, in the region where a lower flank of the main body transitions into the running surface is worked so that a chamfer is created, providing the running surface and at least portions of the chamfer with at least one wear-resistant layer, nitriding the circumferential surface and the lower and upper flanks of the main body that are not provided with the wear-resistant layer so that a section having a defined width and having no nitride layer remains on the flank adjacent the chamfer, and removing the at least one wear-resistant layer to such an extent that a substantially sharp, but unnitrided functional edge is created in the region where the lower flank transitions into the running surface.

11 Claims, 2 Drawing Sheets

(51) Int. Cl.
*C23C 8/80* (2006.01)
*C23C 14/06* (2006.01)
*C23C 14/22* (2006.01)
*C23C 28/00* (2006.01)
*C23C 28/02* (2006.01)
*C23C 30/00* (2006.01)
*F16J 9/26* (2006.01)

(52) U.S. Cl.
CPC .............. *C23C 14/22* (2013.01); *C23C 28/00* (2013.01); *C23C 28/023* (2013.01); *C23C 28/32* (2013.01); *C23C 28/34* (2013.01); *C23C 28/343* (2013.01); *C23C 30/005* (2013.01); *F16J 9/26* (2013.01); *Y10T 29/49281* (2015.01); *Y10T 29/49282* (2015.01); *Y10T 29/49284* (2015.01)

(56) References Cited

FOREIGN PATENT DOCUMENTS

| | | |
|---|---|---|
| DE | 102 59 802 | 7/2004 |
| DE | 103 59 802 | 3/2005 |
| DE | 10 2005 023 627 | 11/2006 |
| DE | 10 2006 003 480 | 7/2007 |
| DE | 10 2007 007 961 | 8/2008 |
| DE | 10 2007 007 965 | 8/2008 |
| DE | 10 2008 004 029 | 9/2009 |
| GB | 1441961 A * | 7/1976 ............... F16J 9/26 |
| GB | 2 136 089 | 9/1984 |
| JP | 54-118958 | 8/1979 |
| JP | 8-184375 | 7/1996 |
| JP | 2006-152981 | 6/2006 |
| JP | 2008-501911 | 1/2008 |
| JP | 2009-287730 | 12/2009 |

* cited by examiner

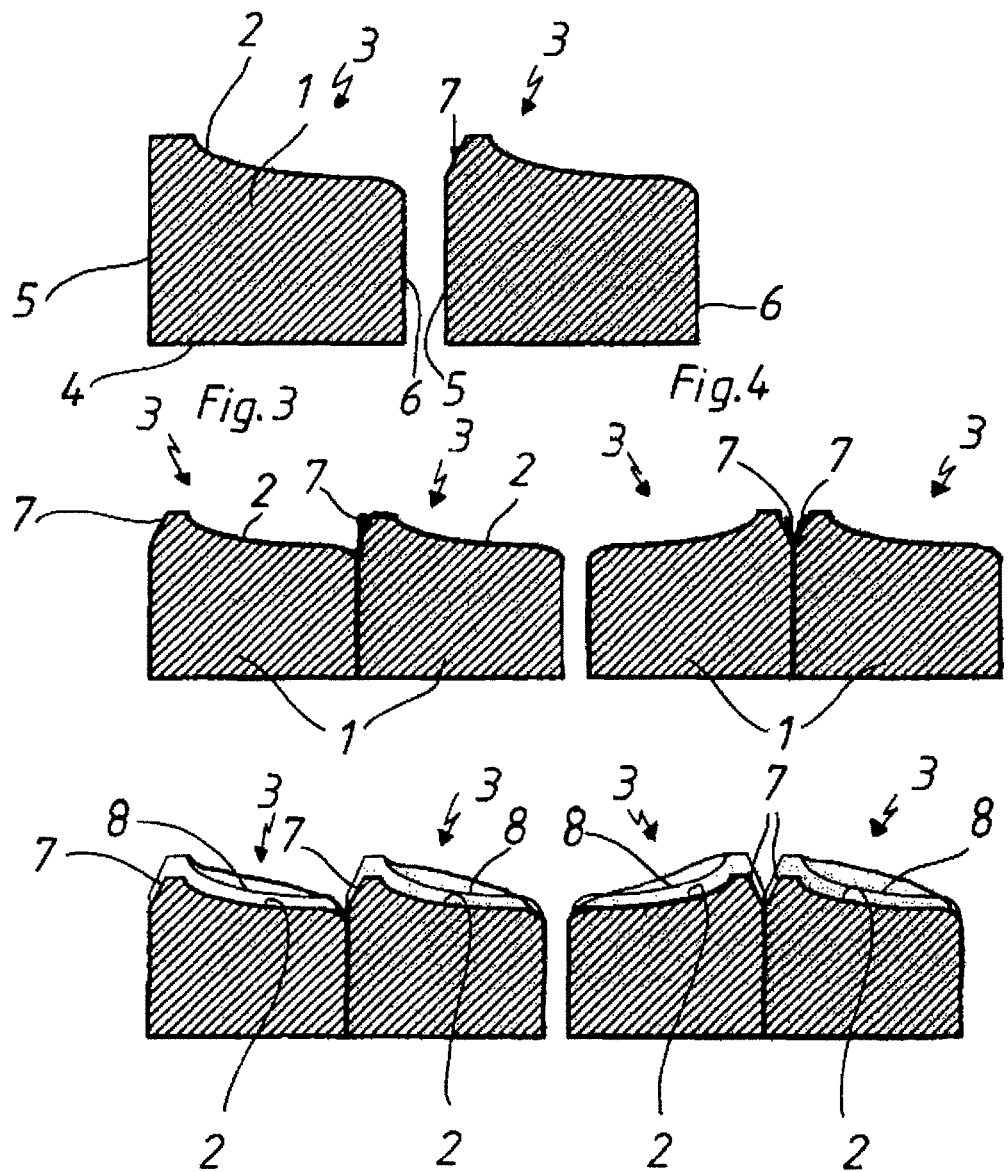

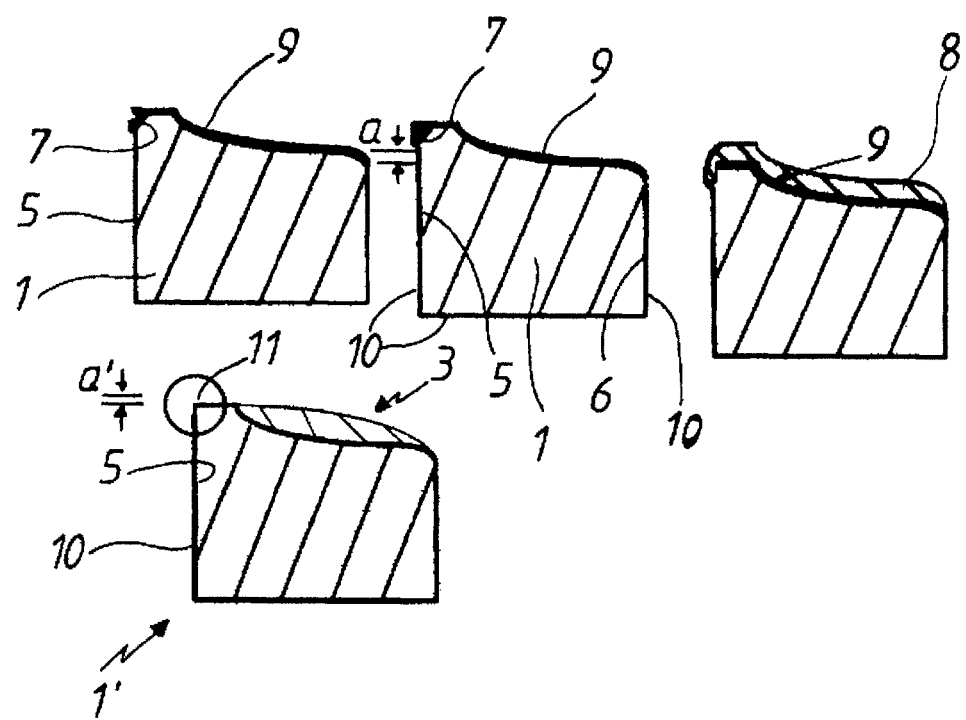

METHOD FOR PRODUCING PISTON RINGS

BACKGROUND OF THE INVENTION

The invention relates to a method for producing a recessed steel piston ring that is provided with a wear-resistant layer.

DE 102 21 800 A1 discloses a method for generating wear protection layers on a steel piston ring by providing at least a portion of the running surface with a running surface coating in a first work step, and providing at least the flanks with a nitride layer by way of plasma nitriding in a second work step, so as to generate a hardness HV 0.1<1400, so that the work step of plasma nitriding is carried out depending on the running surface coating that is used in a temperature range of <490° C.

A steel piston ring is known from DE 10 2005 023 627 A1, comprising a running surface having a recess on one side, upper and lower flanks, and an inner circumferential surface, wherein the running surface is coated with a chromium ceramic-based wear protection layer having microcracks, and at least the flanks are provided with a wear-reducing nitride layer, so that at least one of the regions where the flank transitions into the running surface has an approximately sharp-edged design.

When a recessed PVD-coated steel piston ring is implemented, a sharp functional edge is required. Because of the need for surface nitriding, this was previously not an option. A nitrided edge requires an edge radius of no more than 0.1 mm.

A person skilled in the art considers a sharp edge produced in a standard manner to have rounded region of max. R<0.05 mm.

SUMMARY OF THE INVENTION

It is the object of the invention to provide an alternative method for producing a recessed steel piston ring that is provided with a wear-resistant layer, by way of which a sharp functional edge can be implemented in the transition region between a flank and the running surface.

The object is achieved by a method for producing a recessed steel piston ring that is provided with a wear-resistant layer, by generating a main body having a recess on the running surface side, working the region where a flank of the main body transitions into the running surface so that a chamfer is created, providing the running surface and at least portions of the chamfer with a wear-resistant layer, nitriding the circumferential and flank regions of the main body that are not provided with the wear-resistant layer so that a section having a defined width and having no nitride layer remains in the chamfer-side region of the flank, and finally removing at least the wear-resistant layer to such an extent that a substantially sharp, but unnitrided functional edge is created in the region where the flank transitions into the running surface.

The method according to the invention can advantageously be used for a compression piston ring for an internal combustion engine.

According to a further aspect of the invention, the chamfer is generated mechanically, and in particular by way of grinding.

A chromium layer can be directly applied to the running surface comprising the recess if needed.

As an alternative, there is also the option of applying a thin physical vapor deposition (PVD) or diamond-like carbon (DLC) layer to the running surface.

Depending on the application, there is also the option of applying a chromium layer to a PVD or DLC layer as a further wear-resistant layer.

A person skilled in the art will select the suitable wear protection layer or layers depending on the application.

According to a further aspect of the invention, at least two main bodies are combined into a package (i.e., pack or set) before the wear-resistant layer is applied so as to optimize the production process. In this state, one or the other wear-resistant layer can be applied using known methods.

The option exists here to combine two main bodies having chamfers that are directed toward each other, or several (>2) main bodies having chamfers that are located behind one another, into a package.

Because of the chamfer in the main body, an approximately wedge-shaped notch results with mutually opposing chamfers, which assures that the wear-resistant layer, during application thereof, can also be at least partially deposited in the chamfer region.

In the case of main bodies that are located axially behind one another, more than two main bodies can be combined into a pack or set, whereby cost effectiveness can be further increased.

So as to be able to generate a sharp functional edge, which is made of the material of the main body, according to another aspect of the invention, the nitride-free section on the related flank is of 0.1 to 1.5 mm.

The final operation allows at least the wear-resistant layer outside the recess to be mechanically removed from the running surface, in particular by way of grinding. The material of the main body is ground to the point where the chamfer connects to the flank, if needed, so that the nitride layer, in the finished state of the steel piston ring, is still located approximately 0.05 to 0.7 mm away from the running surface.

The method according to the invention thus allows a sharp, yet unnitrided functional edge to be generated on a recessed steel piston ring in the transition region between the flank and the running surface.

The functional edge is advantageously formed in the transition region of the lower flank, which is to say the flank facing the cylinder crankcase, and the running surface, and thus contributes to allowing residual oil possible to be scraped off, even outside the at least one oil scraper ring.

BRIEF DESCRIPTION OF THE DRAWING

The subject matter of the invention is shown in the drawings based on an exemplary embodiment and is described as follows. In the drawings:

FIG. 1 shows a recessed steel piston ring prior to coating;

FIG. 2 shows a recessed piston ring according to FIG. 1 having a chamfer provided thereon;

FIGS. 3 and 4 show alternative packaging methods of main bodies according to FIG. 2;

FIGS. 5 and 6 show alternative coating methods of the packaged main bodies shown in FIGS. 3 and 4;

FIG. 7 is a schematic diagram of a main body provided with a PVD layer;

FIG. 8 is a schematic diagram of a nitrided main body provided with a PVD layer;

FIG. 9 shows the main body according to FIG. 8, however with a chromium layer applied to the PVD layer; and FIG. 10 shows a finished piston ring having a sharp unnitrided functional edge.

DETAILED DESCRIPTION OF THE INVENTION

FIG. 1 shows a piston ring main body 1 made of steel, comprising a running surface 3 that is provided with a recess 2, an inner circumferential surface 4, a lower flank 5, which is to say a flank facing a cylinder crankcase (not shown) when the piston ring is installed, and an upper flank 6, which is to say a flank facing the combustion chamber (not shown) when the piston ring is installed. This main body 1 is the basic shape for what will later be the piston ring, which can be used as a compression piston ring.

FIG. 2 shows that the region where the flank 5 transitions into the running surface 3 has been worked, for example by way of grinding, so that a chamfer 7 is formed.

FIGS. 3 and 4 show different packaging methods for the main bodies 1 according to FIG. 2.

In FIG. 3, several main bodies 1 are disposed axially behind one another, wherein the chamfers 7 are likewise located axially behind one another. Because the recess 2 leads in the direction of the respective chamfer 7, when coating the running surface 3 it does not present a problem to also provide at least a portion of the chamfer 7 with coating material.

FIG. 4 shows that two main bodies 1 having mutually facing chamfers 7 are disposed in pairs, whereby a kind of wedge is formed. Here too, coating material can be introduced into the region of the chamfer 7 when coating the running surface 3.

FIGS. 5 and 6 show coatings of the running surface 3, and more particularly in relation to FIGS. 3 and 4.

In these examples, a wear-resistant chromium layer 8 is to be applied in the region of the running surface 3, this chromium layer being applied directly to the recessed region 2 and to the remaining regions of the running surface 3. The layer 8 also settles at least over a large portion of the chamfer 7.

FIG. 7 shows an individual main body 1, which has been coated with a PVD layer 9 having a layer thickness of between 1 and 5 μm. Analogously to FIGS. 5 and 6, at least some portions of the flank regions 5 that are provided with the chamfers 7 have likewise been coated with the PVD layer.

It is apparent from FIG. 8 that the main body 1 coated by way of PVD according to FIG. 7 has been nitrided outside the PVD layer 9. The nitride layer 10 is provided on all further circumferential regions 4 and flank regions 5, 6 shown in FIG. 1. However, in the region of the flank 5, the nitride layer 10 does not extend fully to the chamfer 7, so that a nitride layer-free section a having a defined width, for example of 1.5 mm, is present.

FIG. 9 shows that a chromium layer 8, which was already described in FIGS. 5 and 6, has been applied to the PVD layer 9. The same procedures as were already described for FIG. 8 apply.

FIG. 10 shows the finished steel piston ring 1. The layers 8, 9 shown in FIGS. 8 and 9 have been removed enough for a sharp functional edge 11 to be formed in the region where the flank 5 transitions into the running surface 3, wherein a nitride layer 10 ends at a defined distance a' from the functional edge 11, for example of 0.5 mm.

The invention claimed is:

1. A method for producing a recessed steel piston ring, comprising producing a main body that has a running surface, an inner circumferential surface, a pair of flanks each transitioning into both said surfaces, a lower one of the flanks being configured to face a cylinder crankcase and an upper one of the flanks being configured to face a combustion chamber when the piston ring is installed in an internal combustion engine, and a recess on the running surface, and, in a region where the lower flank transitions into the running surface, providing a chamfer, providing the running surface and at least portions of the chamfer with at least one wear-resistant layer, the flanks not being provided with any wear-resistant layer, nitriding the inner circumferential surface and the flanks so that an annular portion of the lower flank of predetermined radial width and having no nitride layer is adjacent the chamfer, and removing at least all said at least one wear-resistant layer to such an extent that a substantially sharp, but unnitrided functional edge is created where the lower flank transitions into the running surface.

2. The method according to claim 1, further comprising combining at least two of the main bodies into a package before applying the at least one wear-resistant layer.

3. The method according to claim 2, wherein two of the main bodies having chamfers that are directed toward one another are combined into a package.

4. The method according to claim 2, wherein more than two of the main bodies having chamfers that are located behind one another are combined into a package.

5. The method according to claim 1, wherein the at least one wear-resistant layer comprises a physical vapor deposition (PVD) or diamond-like carbon (DLC) layer.

6. The method according to claim 5, further comprising applying a chromium layer, as a second wear-resistant layer, to the physical vapor deposition (PVD) or diamond-like carbon (DLC) layer.

7. The method according to claim 1, wherein the removing of the at least one wear-resistant layer is by grinding.

8. The method according to claim 7, wherein material of the main body is ground away approximately to where the chamfer meets to the lower flank.

9. The method according to claim 1, wherein the chamfer is produced by grinding.

10. The method according to claim 1, wherein the at least one wear-resistant layer comprises a chromium layer.

11. The method according to claim 1, wherein the radial width of the nitride layer-free annular portion of the flank is 0.1 to 1.5 mm.

* * * * *